United States Patent [19]

Brunolli

[11] Patent Number: 5,301,305
[45] Date of Patent: Apr. 5, 1994

[54] APPARATUS FOR AMPLIFYING SIGNALS IN PING-PONG ARRANGEMENT TO REDUCE THE FREQUENCY OF AMPLIFICATION

[75] Inventor: Michael J. Brunolli, Escondido, Calif.

[73] Assignee: Brooktree Corporation, San Diego, Calif.

[21] Appl. No.: 616,988

[22] Filed: Nov. 20, 1990

Related U.S. Application Data

[60] Continuation of Ser. No. 315,272, Feb. 24, 1989, abandoned, which is a division of Ser. No. 810,911, Dec. 18, 1985, Pat. No. 4,905,189.

[51] Int. Cl.$^5$ .............................................. G11C 7/06
[52] U.S. Cl. .................................. 395/550; 364/950; 364/950.3; 364/DIG. 2; 365/189.01; 365/189.04; 330/250
[58] Field of Search ............... 364/DIG. 1, DIG. 2; 395/325, 425, 550; 330/250; 365/189.01, 189.04

[56] References Cited

U.S. PATENT DOCUMENTS

| | | | |
|---|---|---|---|
| 4,220,997 | 9/1980 | Hager | 364/900 |
| 4,312,051 | 1/1982 | Miller | 367/68 |
| 4,456,965 | 6/1984 | Graber et al. | 364/900 |
| 4,464,739 | 8/1984 | Moorcroft | 367/130 |
| 4,481,629 | 11/1984 | Hatata et al. | 371/57 |
| 4,697,184 | 9/1987 | Cheal et al. | 342/28 |
| 4,715,017 | 12/1987 | Iwahashi | 365/239 |

Primary Examiner—Thomas C. Lee
Assistant Examiner—Maria N. Von Buhr
Attorney, Agent, or Firm—Ellsworth R. Roston; Charles H. Schwartz

[57] ABSTRACT

Input signals provide binary coded information at a first frequency. A ping-pong arrangement has two (2) substantially identical circuitries. The circuitries operate respectively in synchronism with first and second clock signals each having a frequency half that of the first frequency and each having a phase opposite to the phase of the other. When the first clock signal has a first polarity, the first circuitry produces first voltages representing these signals. In the second polarity of the first clock signal, the first circuitry produces first output signals representing the first voltages. The first circuitry continues producing the first voltages in the clock cycle after the initial production of such voltages. Similarly, the second circuitry produces second voltages representing the input signals in the first polarity of the second clock signal. In the second polarity of the second clock signal, the second circuitry produces second output signals representing the second voltages. The second circuitry continues producing the second voltages in the clock cycle after the initial production of such voltages. The first and second output signals may respectively constitute first pairs. In the first polarity of the first clock signal, the first circuitry equalizes the output signals in the first pair to provide for the subsequent production of updated output signals in the first circuitry in the second polarity of the first clock signal. Similarly, in the first polarity of the second clock signal, the second circuitry equalizes the output signals in the second pair.

33 Claims, 4 Drawing Sheets

APPARATUS FOR AMPLIFYING SIGNALS IN PING-PONG ARRANGEMENT TO REDUCE THE FREQUENCY OF AMPLIFICATION

This is a continuation of application Ser. No. 315,272 filed Feb. 24, 1989, now abandoned, which in turn is a division of application Ser. No. 810,911 filed Dec. 18, 1985 (now U.S. Pat. No. 4,905,189 issued Feb. 27, 1990).

SYNOPSIS OF THE INVENTION

This invention relates to a system for reading information from a random access memory and writing information in such a memory. The invention further relates to a system for providing such reading and/or writing at relatively high frequency of at least one hundred and twenty five (125) megahertz. The invention particularly relates to a system for simultaneously reading binary coded information from a random access memory on a synchronous basis relative to clock signals at a suitable frequency such as approximately one hundred twenty five (125) megacycles and simultaneously reading binary coded information from, or recording binary coded information in, the random access memory on an asynchronous basis relative to the clock signals.

BACKGROUND TO THE INVENTION

Random access memories are provided for storing binary coded information. These memories are versatile because the binary information at different positions in the memory can be read from the memory and because binary coded information can be written in the memory at any desired position to update information previously stored in the memory at such positions. The information read from the memory can be processed by a digital computer or a data processor to obtain certain desired operations such as the movements of a control mechanism and the information written into the memory to update the memory may be obtained from the actual movements of the control mechanism. In this way, any differences between the actual and desired movements of the control mechanism can be corrected.

Random access memories now in use have certain limitations. These result in large part from limitations in the operation of the read/write system associated with the memory for reading information from the memory or writing information in the memory. One of these limitations results from the inability of the read/write system simultaneously to read information from one position in the memory and write information into a second position in the memory. A further limitation results from the limited speed in reading information from the memory or writing information in the memory. This limited speed in turn curtails the speed at which the digital computer or data processing system associated with the memory is able to process information. A third limitation results from the inability of the system to read binary coded information from the memory on a synchronous basis relative to the clock signals and simultaneously read binary coded information from, or record binary coded information in, the memory on an asynchronous basis relative to the clock signals.

A considerable effort has been made over an extended number of years to provide a random access memory system which will overcome the limitations discussed in the previous paragraph. Such effort has been particularly intent in view of the rapid expansion in the uses and perfection of data processing. In spite of such efforts, the capabilities of the random access memory systems still trail the capabilities of the associated data processors and accordingly impose limitations on the operation of these data processors.

SUMMARY OF THE INVENTION

Input signals provide binary coded information at a first frequency. A ping-pong arrangement has two (2) substantially identical circuitries. The circuitries respectively operate in synchronism with first and second clock signals each having a frequency half that of the first frequency. When the first clock signal has a first polarity, the first circuitry produces first voltages representing these signals in the first polarity of the first clock signal. In the second polarity of the first clock signal, the first circuitry produces first output signals representative of the first voltages. The first circuitry continues producing the first voltages in the clock cycle after the initial production of such voltages. Similarly, the second circuitry produces second voltages representative of the input signals in the first polarity of the second clock signal. In the second polarity of the second clock signal, the second circuitry produces second output signals representing the second voltages. The second circuitry continues producing the second voltages in the clock cycle after the initial production of such voltages. The first and second output signals may respectively constitute first and second pairs. In the first polarity of the first clock signal, the first circuitry equalizes the output signals in the first pair to provide for the subsequent production of updated output signals in the first circuitry. Similarly, in the first polarity of the second clock signal, the second circuitry equalizes the output signals in the second pair.

DETAILED DESCRIPTION OF THE DRAWINGS

Figure 1:
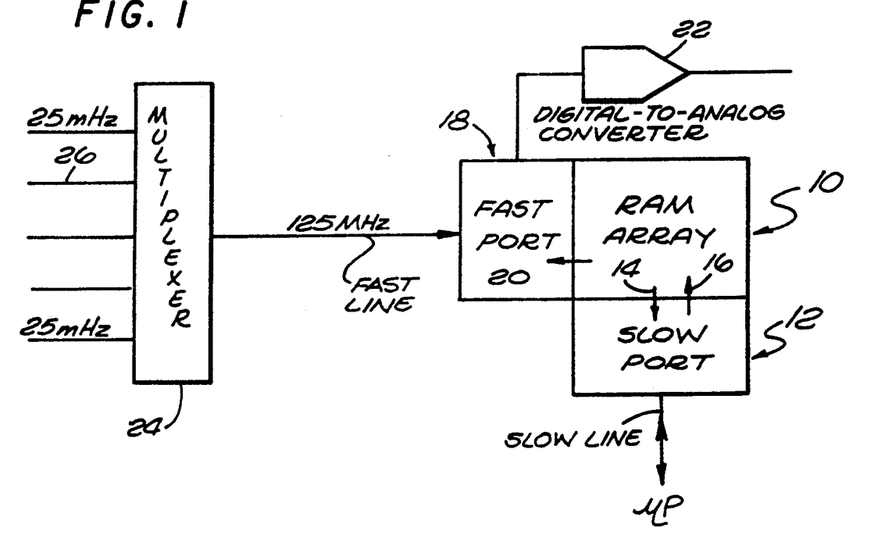
FIG. 1 is a schematic block diagram of a random access memory and of a system for reading first bits of information from first positions in the memory on a synchronous basis relative to clock signals and simultaneously reading second bits of information from, or writing second bits of information in, second positions in the memory on an asynchronous basis relative to the clock signals without having the reading of the first bits of information from the memory affect the reading or writing of the second bits of information.

FIG. 1 illustrates one embodiment of the invention in block form. The embodiment shown in FIG. 1 includes a random access memory generally indicated at 10. The random access memory is adapted to store a plurality of bits of binary coded information in an array in which the position of each binary coded bit in the array is identified by an individual distance along a pair of coordinate axes such as an x-axis and a y-axis. The random access memory is adapted to provide an erasable storage of binary coded information in which the binary coded information at different positions in the memory can be constantly updated. Random access memories are commercially available which can store tens, and even hundreds, of thousands of bits of binary coded information in an array in a relatively small area. The binary coded information may be represented by logic levels of signals in which a first logic level or amplitude represents a binary "1" and a second logic level represents a binary "0".

A slow port generally indicated at 12 is associated with the random access memory 10. The port 12 is adapted to read information from specified positions in the memory 10 or to write binary information in specified positions in the memory. The reading of such binary coded information from the memory 10 is indicated by an arrow 14 and the writing of such information in the memory is indicated by an arrow 16. The reading and writing of such binary coded information may occur on an asynchronous basis relative to clock signals at a suitable frequency such as 125 megahertz.

A fast port generally indicated at 18 is also associated with the memory 10. As indicated by an arrow 201, the fast port 18 is adapted to read information from the memory 10 on a synchronous basis relative to the clock signals at a relatively high frequency such as frequencies of at least 125 megahertz. This frequency is considerably higher than the frequency of the signals in the slow port 12. The signals read in the fast port 18 may be introduced to a digital-to-analog converter 22 which converts the binary signals from the fast port 18 into corresponding analog signals for subsequent processing.

In order to obtain the reading of signals in the fast port 18, the operation of the fast port 18 may be controlled as by a multiplexer 24. The multiplexer 24 produces signals at a reduced frequency, such as approximately twenty-five megahertz (25 mhz), on a plurality (such as 5) of lines 26. The signals in each of the lines 26 are shifted in phase relative to the signals in the other ones of the lines 26. When these signals are combined in the multiplexer 24, the output of the multiplexer is at approximately 125 megacycles.

Figure 2:
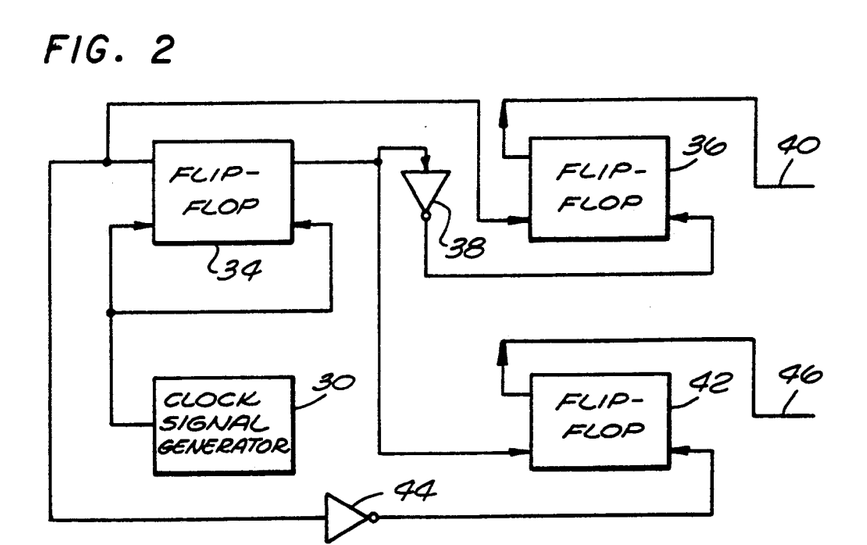
FIG. 2 is a block diagram of a system for producing synchronizing signals for use in the read-write system of FIG. 1.
Figure 3:
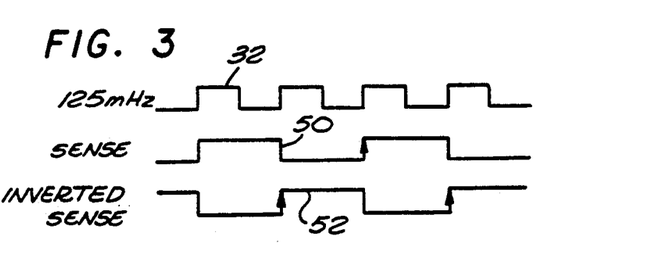
FIG. 3 illustrates waveforms of clock signals which are produced by the system shown in FIG. 2.

FIG. 2 illustrates in block form a system for generating clock signals. The system shown in FIG. 2 includes a clock signal generator 30 which produces signals at a particular frequency such as one hundred and twenty-five megahertz (125 mhz). These signals are illustrated at 32 in FIG. 3. The signals from the clock generator 30 are introduced to true and false input terminals of a flip-flop 34 also having true and false output terminals. The true output terminal of the flip-flop 34 is connected to the true input terminal of a flip-flop 36. The false output signals from the flip-flop 34 are amplified and inverted by an amplifier-inverter 38 and are introduced to the false input terminal of the flip-flop 36. An output line 40 extends from the false output terminal of the flip-flop 36.

Similarly, a connection is made from the false output terminal of the flip-flop 34 to the true input terminal of a flip-flop 42. The false input terminal of the flip-flop 42 receives the signals from an amplifier-inverter 44 corresponding in construction and operation to the amplifier-inverter 38. The operation of the amplifier-inverter 44 is controlled by the signals on the true output terminal of the flip-flop 34. The true output terminal of the flip-flop 42 is connected to an output line 46.

The flip-flop 34 is alternately triggered to the true and false states when the signal 32 changes from a negative polarity to a positive polarity. The flip-flop 34 accordingly produces the signals 32 in FIG. 3. When the flip-flop 34 is triggered to the true state, it triggers the flip-flop 36 to the true state. In the rising amplitude of the next cycle of the clock signals 32, the flip-flop 34 is again triggered to the true state. This causes a negative signal to be produced on the false terminal of the flip-flop 34. This signal is inverted by the amplifier-inverter 38 to trigger the flip-flop 36 to the false state. In this way, synchronizing signals are produced on the output terminal 40 with a frequency one-half ($\frac{1}{2}$) that of the clock signals 32 and with a polarity as indicated at 50 in FIG. 3. The flip-flop 42 also produces synchronizing signals 52 with a frequency one-half ($\frac{1}{2}$) that of the clock signals 32 but with a polarity opposite to the polarity of the signals 50 in FIG. 3. The signals 52 produced by the flip-flop 42 are introduced to the line 46.

Figure 4:
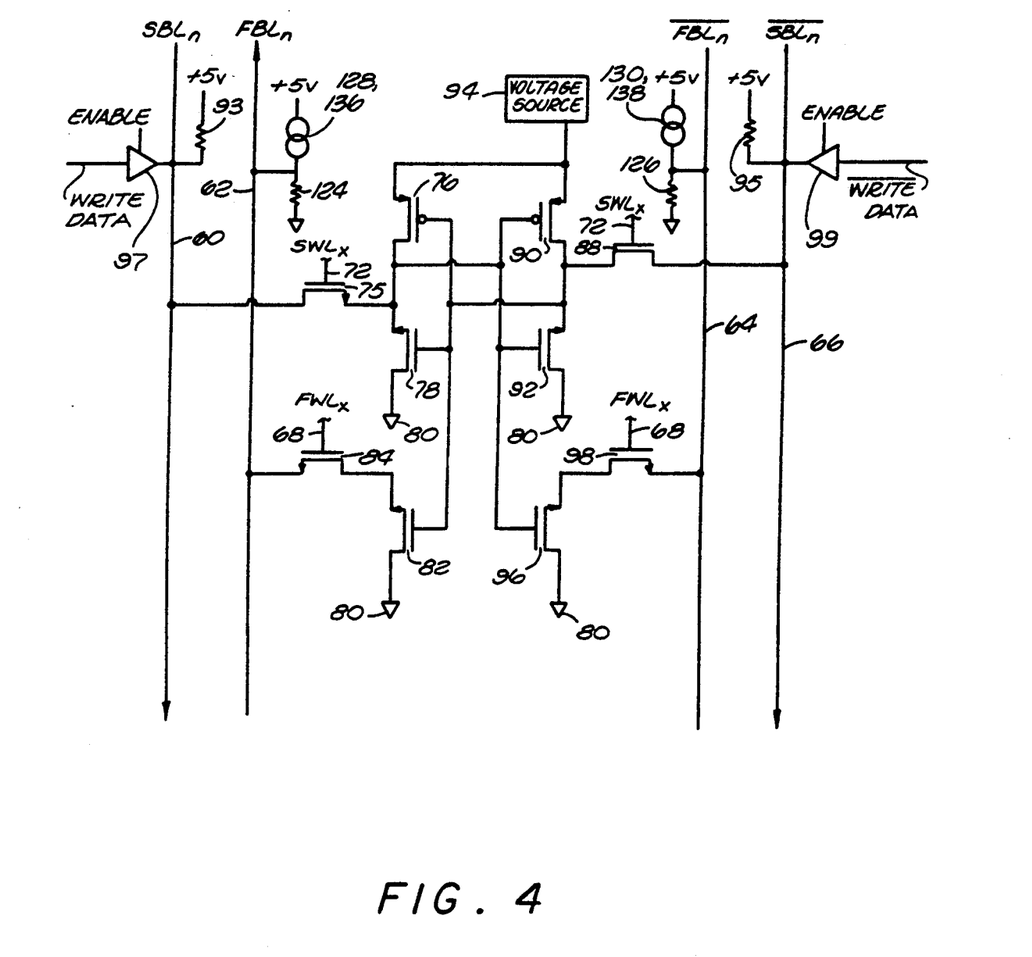
FIG. 4 is a diagram of circuitry which is used in the read-write system shown in FIG. 1 to read first bits of information from a first position in the memory and simultaneously read second bits of information from, or write second bits of information in, second positions in the memory without having the reading of the first bits of information from the memory affect the reading or writing of the second bits of information.

FIG. 4 illustrates circuitry for reading information in the fast port 18 and reading information in, or recording information from, the slow port 12 in FIG. 2. The circuitry shown in FIG. 4 provides for the processing of information in the slow port 12 without any interference from the reading of information in the fast port 18. The circuitry shown in FIG. 4 includes lines 60, 62, 64, 66, 68 and 72. The lines 60 and 66 provide signals respectively coded for logic states of "true" and "false" in a binary bit to be processed in the slow port 12. These signals are respectively indicated as "$SBL_n$" and "$\overline{SBL}_n$". Similarly, the lines 62 and 64 provide signals respectively coded for logic states of "true" and "false" in a binary bit to be processed in the fast port 18. These signals are respectively indicated as "$FBL_n$" and "$\overline{FBL}_n$".

The line 72 provides signals coded for the "x" word to be processed in the slow port 12. These signals are indicated as "$SWL_x$". In like manner, the line 68 provides signals coded for the "x" word to be processed in the fast port 18. These signals are indicated at "$FWL_x$". In other words, the logic levels of signals in the lines 60 and 66 indicate the value of the $n^{th}$ bit in the x word for the slow port and the lines 62 and 64 indicate the value of the $n^{th}$ bit in the x word for the fast port.

The signals on the line 60 are introduced to the drain of an n-transistor 75, the gate of which receives signals from the line 72. The source of the transistor 75 is connected to the drain of a p-transistor 76 and to the drain of an n-transistor 78, the source of which is connected to a suitable reference potential such as a ground 80. The gates of the transistors 76 and 78 have a common connection with the gate of an n-transistor 82. The source of the transistor 82 may be common with the reference potential such as the ground 80. The drain of the transistor 82 is connected to the source of an n-transistor 84. The gate of the transistor 84 receives signals from the line 68 and the source of the transistor 84 receives signals from the line 62.

The line 66 is connected to the source of an n-transistor 88, the gate of which receives signals from the line 72. The drain of the transistor 88 has a common connection with the drain of a p-transistor 90 and the source of an n-transistor 92. The source of the transistor 90 receives an energizing potential such as approximately +5 volts from a suitable voltage source 94, which is also connected to the source of the transistor 76. The gates of the transistors 90 and 92 have a common connection with the drain of the transistor 76, the source of the transistor 78 and the gate of a transistor 96. The drain of the transistor 90 and the source of the transistor 92 have a common connection with the gates of the transistors 76 and 78. The drain of the transistor 96 is connected to the reference potential such as the ground 80. The source of the transistor 96 and the drain of an n-transistor 98 have a common potential. The gate of the transistor 98 receives the signals on the line 68 and the source of the transistor 98 receives the signals on the line 64.

Amplifiers 97 and 99 are respectively connected to the lines 60 and 66. The amplifiers are activated by signals on "Enable" lines. When the amplifiers 97 and 99 are enabled, they pass "write" signals through the amplifiers. The "write" signals passing through the amplifiers 97 and 99 respectively represent a binary "true" and a binary "false".

Current sources 136 and 138 are shown in FIG. 4 as being connected to the lines 62 and 64. These current sources correspond to transistors 136 and 138 in FIG. 6. Resistors 124 and 126 are shown in FIG. 4 as being respectively connected from the signal generators 136 and 138 to the reference potential such as ground. The resistors 124 and 126 are respectively shown as transistors 124 and 126 in FIG. 6. Resistances 93 and 95 are also respectively connected between the lines 60 and 66 and the voltage source 94.

The transistor 84 becomes conductive when a signal of high amplitude is produced on the line 68 to indicate the selection of a particular word, such as the "x" word, and a high signal is simultaneously produced on the line 62 (if the transistor 82 is non-conductive) to indicate a binary value of "1" for a particular bit, such as the "n" bit, in the selected word. When the transistor 84 becomes conductive, current flows through a circuit including the line 62, the transistor 84 and the transistor 82 if the transistor 82 is conductive. This current indicates that the particular bit in the selected word has a binary value of "1". A high impedance in the transistor 82 isolates the current in the line 62 from the reading and recording of information in the lines 60 and 66 at the "x" word and the "n" bit.

In like manner, current flows through a circuit including the line 64, the transistor 98 and the transistor 96 when a signal of high amplitude is produced on the line 68 to indicate the selection of a particular word such as the "x" word, and a signal of high amplitude is simultaneously produced (if the transistor 96 is conductive) on the line 64 to indicate a binary value of "0" for the bit, such as the "n" bit, in the $\overline{FBL}$ line in that word. A high impedance in the transistor 96 isolates the current in the line 64 from the reading and recording of information in the lines 60 and 66 at the "x" word and the "n" bit.

The operation of the circuitry shown in FIG. 4 may be seen from several examples. In one example, a binary value of "1" may be read by the fast port 18 in FIG. 1 at the "n" bit of the "x" word. Under such circumstances, the transistors 84 and 98 may become conductive because of the introduction of a high voltage to their gates from the line 68. Because of the interconnections between the gate of each of the transistors 76 and 90 and the drain of the other one of such transistors, the transistors 76 and 90 operate as a flip-flop. Thus, only one of the transistors 76 and 90 can be conductive at any one time. As a result, assuming that a high voltage is produced on the drain of the transistor 76, a low voltage is simultaneously produced on the drain of the transistor 90. The low voltage on the drain of the transistor 90 prevents the transistor 82 from being conductive and prevents current from flowing through a circuit including the line 62, the transistor 84 and the transistor 82.

The high voltage on the drain of the transistor 76 is introduced to the gate of the transistor 96 to make the transistor 96 conductive. This causes current to flow through a circuit including the current source 138, the line 64, the transistor 98 and the transistor 96. This current causes the current normally flowing through the resistance 126 from the signal generator 138 to be reduced. However, the current normally flowing through the current source 136 and the resistance 124 continues to be maintained because of the non-conductivity of the transistor 82. This causes the voltage on the line 64 to be reduced relative to the voltage on the line 62. This voltage difference indicates a reading of a binary "1" in the fast port 18.

In the next example, a binary "1" is read from the memory 10 by the slow port 12 at the "n" bit of the "x" word. Under such circumstances, a high voltage is introduced to the gates of the transistors 75 and 88 to provide for these transistors to become conductive. The resultant high voltage on the drain of the transistor 75 is introduced to the gate of the transistor 92 to make the transistor 92 conductive. Current accordingly flows through a circuit including the voltage source 94, the resistance 95, the transistor 88 and the transistor 92. The resultant voltage drop across the resistance 95 causes the voltage on the line 66 to be less than the voltage on the line 60. This voltage difference indicates the reading of a binary "1" by the slow port 12.

The transistor 88 has a higher impedance than the transistor 92. This causes a relatively low voltage to be produced on the source of the transistor 92. This voltage is introduced to the gate of the transistor 78 to make the transistor 78 non-conductive. As a result, current cannot flow through a circuit including the line 60, the transistor 75 and the transistor 78. This maintains the voltage on the line 60 higher than the voltage on the line 66 as discussed in the previous paragraph.

In the third example, a binary "1" is written in the memory 10 by the slow port 12 at the "n" bit of the "x" word. Because the "x" word is being activated, the voltage on the transistor 75 is high. At this instant, the amplifiers 97 and 99 are enabled by a signal on the "enabled" line. Upon being enabled, the "write" signal is introduced by the amplifier 97 to the line 60 as a positive voltage. At the same time, a voltage having the reference such as ground is introduced to the line 66 through the amplifier 99. This low voltage is introduced to the source of the transistor 88. A current is accordingly forced by the amplifier 99 to flow through a circuit including the voltage source 94, the transistor 90, the transistor 88 and the line 66.

The high voltage on the line 72 causes the transistor 75 to become conductive so that a high voltage is produced on the source of the transistor. This voltage is introduced to the gate of the transistor 92 to make the transistor 92 conductive. Current accordingly flows through a circuit including the voltage source 94, the transistor 90 and the transistor 92. Since the transistor 90 has a considerably higher impedance than the transistor 92, this current flow causes the voltage on the source of the transistor 92 to have a potential approaching the reference potential such as ground. This voltage is introduced to the gate of the transistor 78 to maintain the transistor 78 non-conductive and thereby maintain the high potential on the source of the transistor 75.

The arrangement described above is advantageous in that the same bit of information may be simultaneously read from the memory 10 (denoted as the "ram array" in FIG. 1) by the fast port 18 and the slow port 12. Actually, the fast port 18 may read the binary coded information previously recorded as the value of a particular position in the memory while the slow port 12 may be writing new binary coded information for that position in the memory. The arrangement shown in FIG. 4 accomplishes this by providing the high gate impedances in the transistors 82 and 96. These high gate impedances isolate, from the slow bit lines 60 and 66 of the slow port 12, any disturbances resulting from the reading through the fast port 18 of the binary coded information from the particular position in the memory 10. As a result, when there is a time coincidence with the writing of binary coded information through the slow port 12 in the particular position in the memory, any disturbances resulting from such reading through the fast port of the binary coded information from the particular position in the memory will be prevented from affecting the writing through the slow port 12 of such binary coded information in the particular position in the memory 10 in such a time coincidence.

Figure 5:
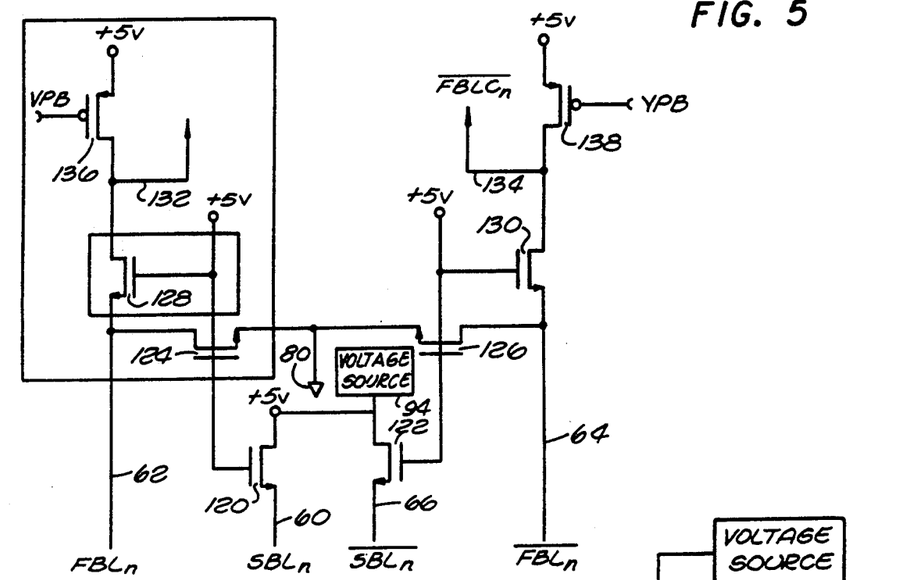
FIG. 5 is a diagram of circuitry for amplifying signals produced by the circuitry shown in FIG. 4 and for providing the amplified signals with optimal characteristics.

FIG. 5 illustrates circuitry for processing the currents flowing in the lines 60, 62, 64 and 66 in FIGS. 4 and 5 so that the signals have a common mode and the deviations of the signals from the common mode represent binary information. The circuitry shown in FIG. 5 includes the lines 60, 62, 64 and 66. The lines 60 and 66 are respectively connected to the sources of n-transistors 120 and 122 having their drains connected to the voltage source 94. Connections are respectively made from the gates of the transistors 120 and 122 to the voltage source 94. The drains of the transistors 124 and 126 are respectively connected to the lines 62 and 64. The sources of the transistors 124 and 126 receive the reference potential such as the ground 80.

The gates of the transistors 120 and 122 are also respectively connected to gates of n-transistors 128 and 130 and are further connected to receive a positive potential from the voltage source 94. The sources of the transistors 128 and 130 respectively receive the signals on the lines 62 and 64. The signals on the drains of the transistors 128 and 130 are respectively applied to intermediate lines 132 and 134 and are also respectively applied to the drains of p-transistors 136 and 138. The sources of the transistors 136 and 138 have a positive potential such as +5 volts applied from the voltage source 94. The gates of the transistors 136 and 138 have a voltage bias (indicated as "VPB") applied to them to bias the transistors to produce a low current.

The transistors 128 and 130 respectively operate as cascode amplifiers. This causes a gain in the order of 1½ to 2 to be produced in each of these cascode amplifiers when a signal is introduced to a particular one of the lines 64 and 66 associated with that amplifier. The signal produced as a result of the operation of the cascode amplifier 128 is introduced to the line 132 and the signal produced as a result of the operation of the cascode amplifier 130 is introduced to the line 134.

The transistors 136 and 138 are biased, by the voltages applied to their gates, to produce a low current in the transistors at all times. The low current in the transistor 136 flows through the cascode amplifier defined by the transistor 128 and through the transistor 124 to the reference potential such as the ground 80. Similarly, the current through the transistor 138 flows through the cascode amplifier defined by the transistor 130 and through the transistor 126 to the reference potential such as the ground 80. The relatively low currents through the transistors 124 and 126 establish a common mode in the lines 62 and 64 to insure that noise in the lines is reduced. In this way, the voltage swings in these lines from the common mode represents binary information.

Figure 6:
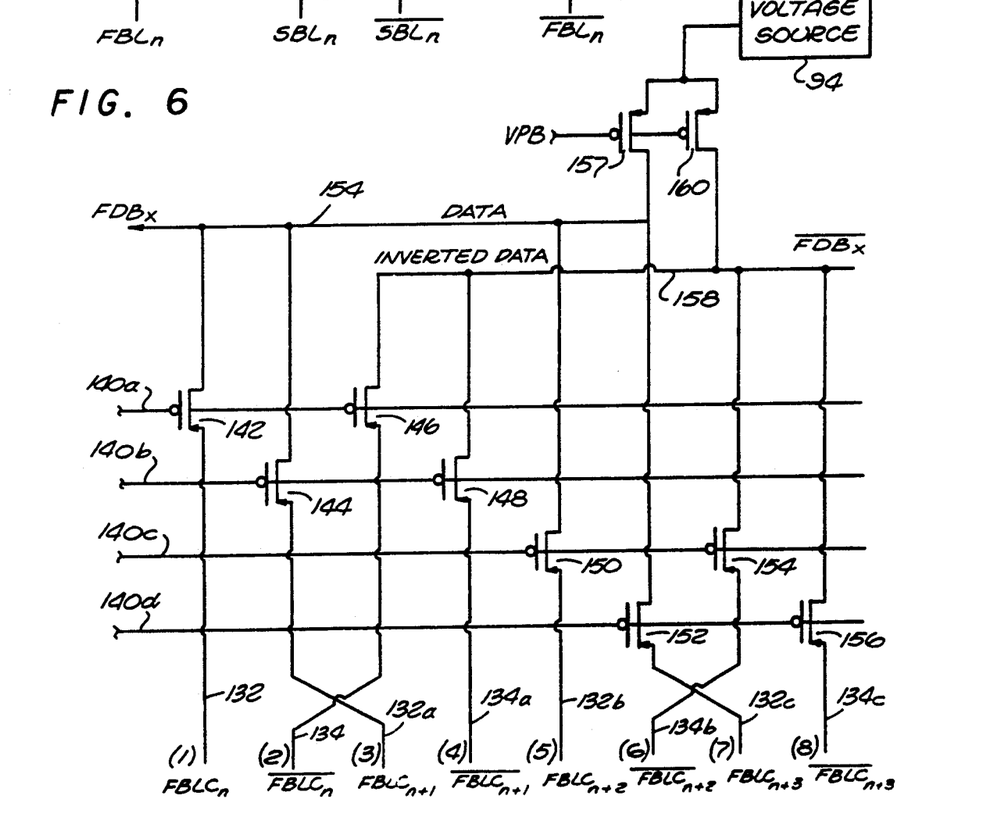
FIG. 6 is a schematic diagram of circuitry for randomly activating a plurality of channels and for introducing to a pair of buses, in accordance with the activation of the different channels, the amplified signals produced by circuitry as shown in FIG. 5.
Figure 7:
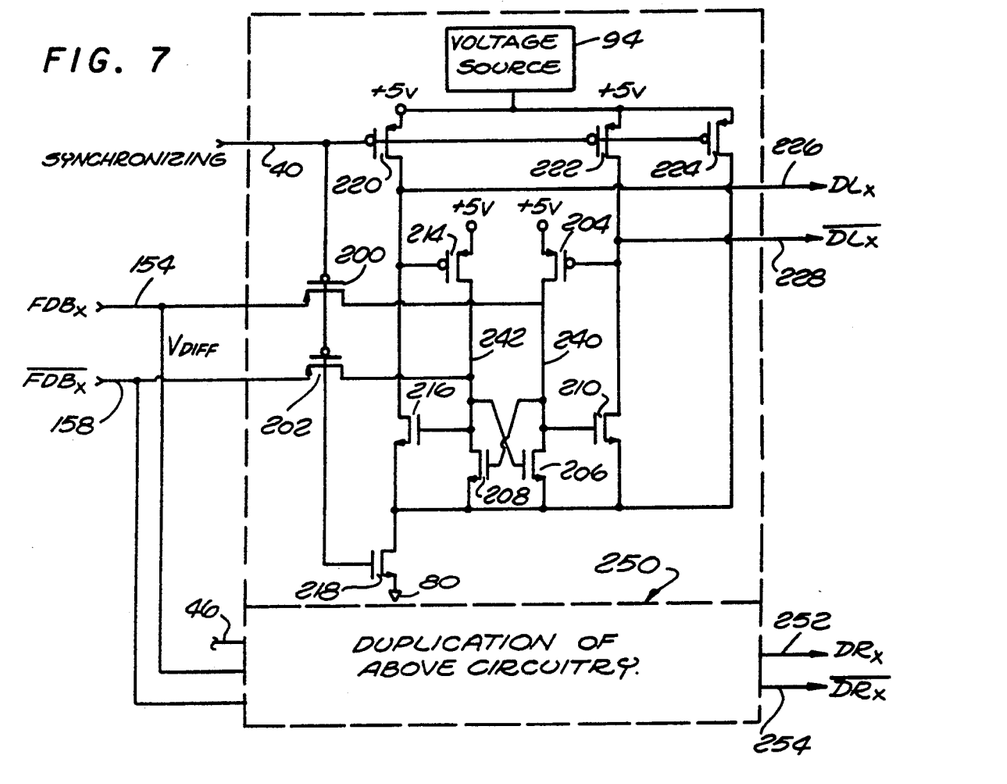
FIG. 7 is a schematic diagram of circuitry for sampling signals from the buses of FIG. 6 during the occurrence of a first polarity in the synchronizing signals and for evaluating the sampled signals upon the occurrence of a second polarity in the synchronizing signals and for introducing the evaluated signals to pairs of output lines.

The intermediate lines 132 and 134 are also shown in FIG. 6. These lines are designated in FIG. 6 as "FBLC$_n$" and "$\overline{FBLC}_n$". Other corresponding pairs of lines are indicated in FIG. 7 at 132a and 134a, (respectively designated as "FBLC$_{n+1}$" and "$\overline{FBLC}_{n+1}$"), 132b and 134b (respectively designated as "FBLC$_{n+2}$" and "$\overline{FBLC}_{n+2}$") and 132c and 134c, (respectively designated as "FBLC$_{n+3}$" and "$\overline{FBLC}_{n+3}$"). A plurality of channels are also indicated in FIG. 6 at 140a, 140b, 140c and 140d. The channels 140a, 140b, 140c and 140d operate as the equivalent of an x-y matrix with the lines 132 and 134, 132a and 134a, etc., to select a particular bit in the memory 10.

The lines 132, 134, 132a, 134a, 132b, 134b, 132c, and 134c respectively have common connections with the drains of p-transistors 142-156 (even numbers only). The signals in the channel 140a are introduced to the gates of the transistors 142 and 146; the signals in the channel 140b are introduced to the gates of the transistors 144 and 148; the signals in the channel 140c are introduced to the gates of the transistors 150 and 154; and the signals in the channel 140d are introduced to the gates of the transistors 152 and 156.

The drains of the transistors 142, 144, 150 and 152 have a common connection with a bus 154 and with the drain of a p-transistor 157. Similarly, the drains of the transistors 146, 148, 154 and 156 have a common connection with a bus 158 and with the drain of a p-transistor 160. The gates of the transistors 157 and 160 are biased to produce a current of relatively low amplitude through the transistors. A voltage is applied to the sources of the transistors from the voltage source 94.

The circuitry of FIG. 6 constitutes a switching matrix. For example, when the amplitude of the signal on the line 132 is high and the channel 140a is energized, current flows through the bus 154 and the transistor 142. Similarly, when a signal is produced on the line 134a to represent a binary "0" and the channel 140b is activated, current flows through the bus 158 and transistor 148. The signals on the buses 154 and 158 may be considered to constitute analog representations of binary logic signals coded for a binary "1" or a binary "0". This results in part from the operation of the amplifier shown in FIG. 5 and described above.

The transistors 157 and 160 operate in a common mode similar to the operation of the transistors 124 and 126 in FIG. 5. As a result of their common mode operation, the transistors 157 and 160 insure that any variations in the voltages on the lines 154 and 158 represent binary coded information. As will be appreciated, the signals produced in the lines 154 and 158 represent signals read from the memory 10 by the fast port 10. The signals on the buses 154 and 158 are respectively represented as "$FDB_x$" and "$\overline{FDB_x}$".

The buses 154 and 158 of FIG. 6 are also shown in FIG. 7. The synchronizing signal lines 40 and 46 of FIG. 2 are also shown in FIG. 7. The signals on the lines 154 and 158 are respectively introduced to the sources of p-transistors 200 and 202 and the signals on the clock line 40 are introduced to the gates of these transistors. The drain of the transistor 200 has common connections with the drain of a p-transistor 204, the drain of an n-transistor 206, the gate of an n-transistor 208 and the gate of an n-transistor 210. Similarly, connections are made from the drain of the transistor 202 to the drain of a p-transistor 214, the drain of the transistor 208, the gate of the transistor 206 and the gate of an n-transistor 216.

The sources of the transistors 204 and 214 receive a positive potential from the voltage source 94. The sources of the transistors 206, 208, 210 and 216 have a common connection with the source of an n-transistor 218. The drain of the transistor 218 is common with the reference potential such as the ground 80. The gate of the transistor 218 receives the signals on the synchronizing line 40.

The synchronizing line 40 is also connected to the gates of p-transistors 220, 222 and 224. The sources of the transistors 220, 222 and 224 receive a positive potential from the voltage source 94. The drain of the transistor 220 has common connections with the gate of the transistor 214 and the drain of the transistor 216 and with an output line 226. The output line 226 is designated as "$DL_x$". Output connections are made from the drain of the transistor 222 to the gate of the transistor 204, the source of the transistor 210 and an output line 228. The output line 228 is designated as $\overline{DL_x}$. The drain of the transistor 224 has a common connection with the drain of the transistor 218.

When the amplitude of the clock signal on the line 40 is low, the transistor 200 becomes conductive. A signal of high amplitude is accordingly introduced to a line 240 common to the drain of the transistor 204 and the source of the transistor 206. This signal has a higher amplitude than the signal on a line 242 common to the drain of the transistor 214 and the drain of the transistor 208. The reason is that the transistor 202 remains non-conductive because of a low voltage on the line 158. The production of a signal of high amplitude on the line 240 may be considered to constitute a sampling of the voltage on the lines 154 and 158 during the negative half cycle of the clock signal on the line 40.

Upon the occurrence of a positive polarity in the clock signal 50 on the line 40, the transistor 218 becomes conductive because of the introduction of the synchronizing signal to the gate of the transistor. This causes the voltage on the source of the transistor 218 to decrease to substantially the reference potential such as the ground 80. Because of the high potential on the line 240, the transistor 208 becomes conductive and produces on its source a potential approaching the reference potential such as the ground 80. This voltage is introduced to the gate of the transistor 206 to insure that the transistor 206 will remain non-conductive.

When the voltage on the source of the transistor 218 approaches the reference potential such as the ground 80, the transistor 210 becomes conductive because of the introduction of the high voltage to its gate from the line 240. This causes the voltage on the bus 228 to approach the reference potential such as ground. The resultant reference potential, such as the ground 80, on the gate of the transistor 204 causes the transistor 204 to become conductive. This prolongs a voltage of high amplitude on the line 240 and insures that the transistors 208 and 210 will be strongly conductive. The production of the reference potential such as ground on the bus 228 during the positive half cycle of the clock signal on the line 40 may be considered to constitute an evaluation of the voltage on the lines 154 and 158.

In the next half cycle (the negative half cycle) of the synchronizing (or clock) signal 50 on the line 40, the transistors 220, 220 and 222 become conductive. When the transistors 222 and 224 become conductive, they introduce the same voltages (the voltage from the voltage source 94) to the lines 226 and 228 to assure that any difference in the potentials on these lines in the previous half cycle of the synchronizing signal is eliminated. This insures that a considerable difference in potential will be produced in the lines 226 and 228 in the subsequent half cycle (the positive half cycle) of the synchronizing signals on the line 40. When the transistor 224 becomes conductive in the negative half cycle of the synchronizing signal 50 on the line 40, it provides a positive voltage to the source of the transistor 218 to insure that the transistor will become conductive in the subsequent half cycle (the positive half cycle) of the clock signals.

When a positive signal is produced on the line 158 to indicate a binary value of "0", the signal on the line 242 has a higher amplitude than the signal on the line 240 during the negative half cycle of the synchronizing signal 50 on the line 40. This may be considered to constitute a sampling of the voltages on the lines 154 and 158. As a result, when the transistor 218 becomes conductive in the next half cycle (the positive half cycle) of the synchronizing signal 50, the transistors 206 and 216 become conductive and the voltage on the line 226 approaches the reference potential such as the ground 80. This may be considered to constitute an evaluation of the voltages on the lines 154 and 158 in the positive half cycle of the clock signal on the line 40.

The circuitry shown in detail in FIG. 7 and described above is duplicated in second stages which are included within a box generally indicated at 250 and shown in the broken lines in FIG. 7. However, the stages 250 receive the synchronizing signals 52 on the clock line 46. Since these signals are displaced by 180° in phase from the synchronizing signals 50 on the line 40, the signals produced on output lines 252 and 254 are displaced in phase by 180° from the signals produced on the lines 226 and 228. The signals on the output lines 252 and 254 are respectively indicated as "$\overline{DR_x}$" and "$DR_x$" on FIG. 7. In other words, the signals produced in the buses 154 and 158 are sampled in the stage 250 in one half cycle of the synchronizing signals 50 in FIG. 1 while the signals produced on the buses 154 and 158 in the previous half cycle of the synchronizing signals 50 are evaluated by the stage shown in detail in FIG. 8. In the next half cycle of the synchronizing signals 50, the signals sampled in the stage 250 in the previous half cycle of the synchronizing signals 50 are evaluated by the stage 250 while the stage shown in detail in FIG. 7 is sampling the signals on the buses 154 and 156.

Figure 8:
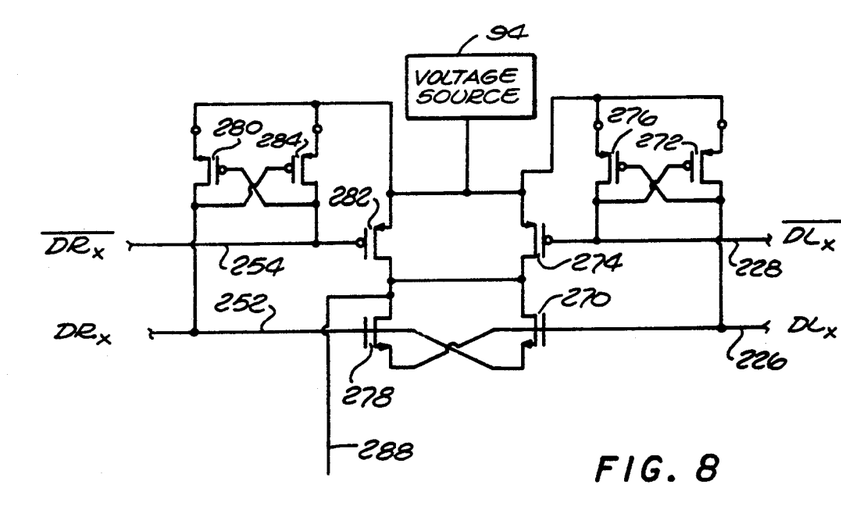
FIG. 8 is a schematic diagram of circuitry for processing the signals produced on the output lines in FIG. 7 to introduce the signals from only one of the output lines to a resultant line at each instant.

The circuitry shown in FIG. 8 includes the lines 226 and 228 and the lines 252 and 254. The lines 226, 228, 252 and 254 are respectively connected to the gates of transistors 270 and 272, the gates of transistors 274 and 276, the gates of transistors 278 and 280 and the gates of transistors 282 and 284. The transistors 270 and 278 are n-transistors and the transistors 272, 274, 276, 280, 282 and 284 are p-transistors. Connections are also respectively made from the lines 226, and 228 to the drain of the transistor 272 and the drain of the transistor 278. Similarly, the lines 252 and 254 are respectively connected to the drains of the transistors 280 and 284.

The sources of the transistors 272, 274, 276, 280, 282 and 284 receive a positive potential such as +5 volts from the voltage source 94. The drains of the transistors 274 and 282 are respectively common with the source of the transistors 270 and 278. A resultant line 288 extends from a common connection between the drains of the transistors 274, 282, 270 and 278.

A signal of low amplitude is produced on only one of the lines 226, 228, 252 and 254 at any time to represent binary coded information and signals of relatively high amplitude are simultaneously produced on the other ones of the output lines 226, 228, 252 and 254. By way of illustration, a signal of low amplitude may be produced on the line 226 and a signal of high amplitude may be simultaneously produced on the lines 228, 252 and 254. When the amplitude of the signal on the line 226 is low, it introduces a low voltage to the drain of the transistor 278. At the same time, a signal of high voltage is introduced to the gate of the transistor 278 from the line 252. This causes the transistor 278 to become conductive so that the voltage on the drain of the transistor approximates the voltage on the source of the transistor and a signal of low amplitude is produced on the resultant line 288. The low voltage on the drain of the transistor 278 also appears on the drains of the transistors 282 and the source of the transistor 274 and 270 and prevents these transistors from becoming conductive.

To insure the operation of the transistors 270, 274, 278 and 282 as discussed above, the signals on the lines 226 and 228 are respectively introduced to the transistors 272 and 276. These signals prevent the transistor 272 from becoming conductive and cause the transistor 276 to become conductive. This causes a high voltage to be produced on the drain of the transistor 276 and to be introduced to the gate of the transistor 274 to prevent the transistor 274 from becoming conductive.

It may sometimes happen that a signal of low amplitude is produced on the line 228. At the same time, signals of high amplitude are produced on the lines 226, 252 and 254. The signal of low amplitude on the line 228 is introduced to the gate of the transistor 274 to make the transistor conductive. This causes the drain of the transistor 274 to have a high voltage, this voltage being introduced to the resultant line 288. At the same time, the transistors 270 and 278 are not conductive. The reason is that each of these transistors has the same voltage on its gate and its source because of the high voltages on the lines 226 and 252. The transistor 282 is not conductive because a high voltage is introduced to its gate from the line 254.

The transistors 272 and 276 operate to insure that the transistors 270, 274, 278 and 282 will operate as discussed in the previous paragraphs when the line 228 has a signal of low amplitude and the lines 226, 252 and 254 have signals of high amplitude. These signals prevent the transistor 276 from become conductive and cause the transistor 272 to become conductive. The resultant high voltage on the drain of the transistor 272 insures that the transistor 270 will remain non-conductive.

As will be seen, the circuit shown in FIG. 8 is symmetrical in that the lines 226 and 252 have the same connections and the lines 228 and 254 have the same connections. As a result, the discussion above with respect to the introduction of a signal of low amplitude on the line 226 is applicable to the introduction of a signal of low amplitude on the line 252. Similarly, the discussion above with respect to the introduction of a signal on the line 228 is also applicable to the introduction of a signal on the line 254.

The invention described above has certain important advantages. It provides for the reading of binary coded information from the memory 10 by the fast port 18 at the same time that binary coded information is read from, or written into, the memory 10 by the slow port 12. The simultaneous transducing action is obtained by the fast port 18 and the slow port 12 without obtaining any interference between the actions of the fast and slow ports. This results from the operation of the circuitry shown in FIG. 4 and described above. Actually, both the fast port 18 and the slow port 12 may simultaneously read the same bit of information from the memory.

The invention described above also has other important advantages. It provides for the reading of binary coded information by the fast port 18 on a synchronous basis with signals from the clock signal generator 30 but provides for the reading or writing of binary coded information by the slow port 12 on an asynchronous basis relative to the clock signals. This synchronous-asynchronous relationship between the operation of the fast port 18 and the slow port 12 is especially significant because the reading of binary coded information from the fast port 18 occurs at a high frequency such as approximately one hundred and twenty five megahertz (125 mhz).

The operation of the fast port 18 also offers other important advantages in addition to those specified above. For example, the fast port 18 reads binary coded information from the random access memory 10 in each half cycle of the synchronizing signals 50 and 52 shown in FIG. 3. The fast port 18 samples, in a first stage, first bits of such binary coded information in the negative half cycles of the synchronizing signals 50 and evaluates the sampled information in the positive half cycles of the such synchronizing signals. The fast port 18 samples, in a second stage identical in construction to the first stage, second bits of such binary coded information in the positive half cycles of the signals 52 and evaluates such sampled information in the negative half cycles of such synchronizing signals.

In this way, the frequency of the fast port 18 in reading binary coded information from the memory 10 is effectively doubled without any loss in the ability to read such information. The stages (FIG. 7) sampling and evaluating the binary coded information read by the fast port 18 from the memory 10 also operate advantageously in prolonging the evaluation of the sampled signals in the next half cycles after each such sampling. The circuitry shown in FIG. 8 then introduces such evaluated signals to the resultant line 288 on an exclusive basis whereby the signal from only one of the output lines 226, 228, 252, and 254 can be introduced to the resultant line at each instant.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination,
   means for providing at a first particular frequency first signals having first and second logic levels respectively coded for binary values "1" and "0",
   means for providing first and second synchronizing signals each having a second particular frequency half of that of the first particular frequency and each having first and second alternating polarities and each displaced in phase by 180° from the other,
   first means responsive to the first synchronizing signals and the first signals for producing, in the first polarity of the first synchronizing signals, first voltages representative of the first signals and for producing, in the second polarity of the first synchronizing signals, first output signals representative of the first voltages,
   second means responsive to the second synchronizing signals and the first signals for producing, in the first polarity of the second synchronizing signals, second voltages representative of the first signals and for producing, in the second polarity of the second synchronizing signals, second output signals representative of the second voltages,
   a resultant line, and
   means for respectively introducing the first and second output signals to the resultant line.

2. In a combination as set forth in claim 1,
   the first means being operative, in the second polarity of the first synchronizing signals, to continue the production of the first voltages after the initial production of the first voltages and the second means being operative, in the second polarity of the second synchronizing signals, to obtain the continued production of the second voltages after the initial production of the second voltages.

3. In a combination as set forth in claim 1,
   first and second output lines,
   the first output signals constituting a first pair of signals having complementary binary characteristics,
   one of the signals in the first pair being provided on the first output line in the second polarity of the first synchronizing signals and the other one of the signals in the first pair being provide don the second output line in the second polarity of the first synchronizing signals,
   third and fourth output lines,
   the second output signals, constituting a second pair of signals having complementary binary characteristics,
   one of the complementary signals in the second pair being provided on the third output line in the second polarity of the second synchronizing signals and the other one of the complementary signals in the second pair being provided on the fourth output line in the second polarity of the second synchronizing signals.

4. In a combination as recited in claim 3,
   means responsive to the first polarity of the first synchronizing signals for producing equal voltages on the first and second output lines, and
   means responsive to the first polarity of the second synchronizing signals for producing equal voltages on the third and fourth output lines.

5. In combination,
   a first bus,
   a second bus,
   means for producing at a first frequency first and second synchronizing signals, each of the first and second synchronizing signals alternately having first and second polarities, the second synchronizing signals being displaced by 180° in phase from the first synchronizing signals,
   means for providing, at a second frequency twice that of the first frequency, a pair of complementary first signals and for respectively introducing the pair of first signals to the first and second buses,
   a first output line,
   a second output line,
   a third output line,
   a fourth output line,
   first means responsive to the first synchronizing signals and the pair of the first signals on the first and second buses for sampling such signals to produce a first pair of complementary voltages representative of such signals and for respectively introducing the first pair of complementary voltages to the first and second output lines in the second polarity of the first synchronizing signals, and
   second means responsive to the second synchronizing signals and the pair of the first signals on the first and second buses for sampling such signals, in the first polarity of the second synchronizing signals, to produce a second pair of complementary voltages representative of such sampled signals and for respectively introducing the second pair of complementary voltages to the third and fourth output lines in the second polarity of the second synchronizing signals.

6. In a combination as set forth in claim 5,
   means responsive to the first polarity of the first synchronizing signals for equalizing the voltages on the first and second output lines, and
   means responsive to the first polarity of the second synchronizing signals for equalizing the voltages on the third and fourth output lines.

7. In a combination as set forth in claim 5,
   the first means including means operative in the second polarity of the first synchronizing signals for continuing the production of the first pair of complementary voltages on the first and second output lines after the initial production of such voltages on such output lines, and
   the second means including means operative in the second polarity of the second synchronizing signals for continuing the production of the second pair of complementary voltages on the third and fourth output lines after the initial production of such voltages on such output lines.

8. In combination, memory means having a plurality of positions for storing signals having first and second logic levels respectively coded for binary values of "1" and "0", first means for reading the logic levels of the signals from the memory means at a first particular frequency, second means for providing first clock signals alternately having first and second opposite polarities and having a frequency half that of the first particular frequency, third means including first terminals and responsive to the logic levels of the signals read by the first means from the memory means and to the clock signals for sampling the logic levels of such read signals in first half cycles of the clock signals to produce first voltages at the first terminals and for producing first output signals at the first terminals in the other half cycles of the clock signals in accordance with the characteristics of the first voltages, and fourth means including second terminals and responsive to the logic levels of the signals read by the first means from the memory means and to the clock signals for sampling the logic levels of such read signals in the other half cycles of the clock signals to produce second voltages at the second terminals and for producing second output signals at the second terminals in the first half cycles of the clock signals in accordance with the characteristics of the first voltages.

9. A combination as set forth in claim 8, including, a resultant line, and means for introducing the first and second output signals to the resultant line.

10. A combination as set forth in claim 9, including, the first output signals constituting a first pair of complementary output signals and the second output signals constituting a second pair of complementary output signals, means for providing a first pair of output lines, means for producing, on one of the output lines in the first pair, one of the complementary output signals in the first pair, means for producing, on the other output line of the first pair, the other one of the complementary output signals in the first pair, means for providing a second pair of output lines, means for producing, on one of the output lines of the second pair, one of the complementary output signals in the second pair, means for producing, on the other output line in the second pair, the other one of the complementary output signals in the second pair, a resultant line, and means for introducing the output signals on individual ones of the first and second pairs of output lines to the resultant line.

11. A combination as set forth in claim 10, including, means for equalizing, in the first half cycles of the clock signals, the complementary output signals in the first pair, and means for equalizing, in the other half cycles of the clock signals, the complementary output signals in the second pair.

12. A combination as set forth in claim 11, including, means for continuing the production, in the other half cycles of the clock signals, of the complementary output signals in the first pair after the initial production of such complementary output signals, and means for continuing the production, in the first half cycles of the clock signals, of the complementary output signals in the second pair after the initial production of such complementary output signals.

13. In combination, first means for providing binary coded signals at a first particular frequency, second means for providing first clock signals alternately having first and second opposite polarities at a second particular frequency half that of the first particular frequency, third means for providing second clock signals alternately having first and second opposite polarities at the second particular frequency, the second clock signals being displaced by a phase angle of 180° from the first clock signals, fourth means for sampling the binary coded signals in the first polarity of the first clock signals to produce first voltages and for producing first output signals in the second polarity of the first clock signals in accordance with the characteristics of the first voltages, and fifth means for sampling the binary coded signals in the first polarity of the second clock signals to produce second voltages and for producing second output signals in the second polarity of the second clock signals in accordance with the characteristics of the second voltages.

14. In a combination as set forth in claim 13, sixth means for providing third clock signals at the first particular frequency and the second means operating upon the third clock signals to provide the first clock signals and the third means operating upon the third clock signals to provide the second clock signals.

15. In a combination as set forth in claim 13, the fourth means including first and second terminals and including means for producing the first voltages on a complementary basis at the first and second terminals in the first polarity of the first clock signals and further including first and second output lines and means responsive to the complementary first voltages at the first and second terminals in the second polarity of the first clock signals for producing the first output signals on a complementary basis at the first and second output lines, the fifth means including third and fourth terminals and including means for producing the second voltages on a complementary basis at the third and fourth terminals in the first polarity of the second clock signals and further including third and fourth output lines and means responsive to the complementary second voltages at the third and fourth terminals in the second polarity of the second clock signals for producing the second output signals on a complementary basis at the third and fourth output lines.

16. In a combination as set forth in claim 15, sixth means for providing clock signals at the first particular frequency and the second means operating upon such clock signals to provide the first clock signals at the second particular frequency and the third means operating upon such clock signals at the first particular frequency to provide the second clock signals at the second particular frequency, the fourth means including means for equalizing, in the first polarity of the first clock signals, the complementary first output signals on the first and second output lines, and the fifth means including means for equalizing, in the first polarity of the second clock signals, the complementary second output signals on the third and fourth output lines.

17. In combination, first means for providing binary coded signals at a first particular frequency, second means for providing first clock signals alternately having first and second opposite polarities at a second particular frequency half of that of the first particular frequency, third means for providing second clock signals alternately having first and second opposite polarities at the second particular frequency, the phase of the second clock signals being opposite at each instant to the phase of the first clock signals, fourth means responsive to the binary coded signals and the first clock signals for producing first voltages, in the first polarities of the first clock signals, in accordance with the binary coded signals, fifth means responsive to the first voltages and the first clock signals for producing, in the second polarities of the first clock signals, first output signals representative of the first voltages, sixth means responsive to the binary coded signals and the second clock signals for producing second voltages, in the first polarities of the second clock signals, in accordance with the binary coded signals, the second voltages corresponding to the first voltages when the binary coded signals are substantially identical in successive ones of the second clock signals, and seventh means responsive to the second voltages and the second clock signals for producing, in the second polarities of the second clock signals, second output signals representative of the second voltages.

18. In a combination as set forth in claim 17, eighth means for providing third clock signals at the first particular frequency, the second means being responsive to the third clock signals to produce the first clock signals, the third means being responsive to the third clock signals at the first particular frequency to produce the second clock signals.

19. In a combination as set forth in claim 17, eighth means for equalizing, in the first polarity of the first clock signals, the first output signals, ninth means for equalizing, in the first polarity of the second clock signals, the second output signals.

20. In a combination as set forth in claim 17, the binary coded signals having first characteristics to represent a binary "1" and having second characteristics to represent a binary "0", the sixth means including first and second terminals, the sixth means being responsive to the first characteristics in the binary coded signals to produce the first output signals at the first terminal and being responsive to the second characteristics in the binary coded signals to produce the first output signals at the second terminal, the seventh means including third and fourth terminals, the seventh means being responsive to the first characteristics in the binary coded signals to produce the second output signals at the third terminal and being responsive to the second characteristics in the binary coded signals to produce the second output signals at the fourth terminal.

21. In a combination as set forth in claim 19, the binary coded signals having first characteristics to represent a binary "1" and having second characteristics to represent a binary "0", the sixth means including first and second terminals, the sixth means being responsive to the first characteristics in the binary coded signals to produce the first output signals at the first terminal and being responsive to the second characteristics in the binary coded signals to produce the first output signals at the second terminal, the seventh means including third and fourth terminals, the seventh means being responsive to the first characteristics in the binary coded signals to produce the second output signals at the third terminal and being responsive to the second characteristics in the binary coded signals to produce the second output signals at the fourth terminal.

22. In combination, first means for providing binary coded signals at a first particular frequency, the binary coded signals respectively having first binary codings representing a binary "1" and second binary codings representing a binary "0", second means for providing first clock signals alternately having first and second opposite polarities at a second particular frequency half of that of the first particular frequency, third means for providing second clock signal alternately having first and second opposite polarities at the second particular frequency, the phase of the second clock signals being opposite at each instant to the phase of the first clock signals, first and second lines, fourth means responsive to the first binary codings in the binary coded signals and to the first polarity of the first clock signals for producing a first voltage on the first line and a second voltage on the second line and responsive to the second binary coding in the binary coded signals and to the first polarity of the first clock signals for producing the first voltage on the second line and the second voltage on the first line, fifth means responsive to the voltages on the first and second lines and the second polarity of the first clock signals for producing first output signals representative of such voltages, third and fourth lines, sixth means responsive to the first binary codings in the binary coded signals and to the first polarity of the second clock signals for producing the first voltage on the third line and the second voltage on the fourth line and responsive to the second binary codings in the binary coded signals and to the first polarity of the second clock signals for producing the first voltage on the fourth line and the second voltage on the third line, and seventh means responsive to the voltages on the third and fourth lines and the second polarity of the second clock signals for producing second output signals representative of such voltages.

23. In a combination as set forth in claim 22,
a first pair of output lines for receiving the first output signals from the fifth means in the second polarity of the first clock signals, the first output signals from the fifth means in the second polarity of the first clock signals being complementary,
eighth means responsive to the first polarity of the first clock signals for equalizing the first output signals on the first pair of output lines,
a second pair of output lines for receiving the second output signals from the seventh means in the second polarity of the second clock signals, the second output signals from the seventh means in the second polarity of the second clock signals being complementary, and
ninth means responsive to the first polarity of the second clock signals for equalizing the second output signals on the second output lines.

24. In a combination as set forth in claim 22,
the fourth means including eighth means having conductive and non-conductive states and responsive to the first polarity of the first clock signals for producing a non-conductive state in the eighth means and responsive to the second polarity of the first clock signals for producing the conductive state in the eighth means,
the fifth means including ninth means responsive to the conductive state in the eighth means and to the voltages on the first and second lines for producing the first output signals,
the sixth means including tenth means having conductive and non-conductive states and responsive to the first polarity of the second clock signals for producing a non-conductive state in the tenth means and responsive to the first polarity of the second clock signals for producing the conductive state in the tenth means,
the seventh means including eleventh means responsive to the conductive state in the tenth means and to the voltages on the third and fourth lines for producing the second output signals.

25. In a combination as set forth in claim 22,
the fourth means and the sixth means having substantially identical constructions and the fifth means and the seventh means having substantially identical constructions.

26. In combination,
means for providing analog representations of binary signals having first and second logic levels respectively coded for binary values of "1" and "0",
means for providing first and second synchronizing signals each having first and second alternating polarities and each displaced in phase by 180° from the other,
first means responsive to the first synchronizing signals and the analog representations of the binary signals for sampling the analog representations in the first polarity of the first synchronizing signals to produce first voltages and for producing, in the second polarity of the first synchronizing signals, first output signals representative of the first voltages,
second means responsive to the second synchronizing signals and the analog representations of the binary signals for sampling the analog representations in the first polarity of the second synchronizing signals to produce second voltages and for producing, in the second polarity of the second synchronizing signals, second output signals representative of the second voltages,
a resultant line, and
means for introducing the first and second output signals to the resultant line.

27. In a combination as set forth in claim 26,
first terminals in the first means,
the first means including means for producing the first voltages at the first terminals in the first means in the first polarity of the first synchronizing signals,
second terminals in the second means,
the second means including means for producing the second voltages at the second terminals in the second means in the second polarity of the second synchronizing signals.

28. In a combination as set forth in claim 26,
the first means including means for continuing the production of the first voltages after the initial production of such voltages,
the second means including means for continuing the production of the second voltages after the initial production of such voltages.

29. In a combination as set forth in claim 26,
the first output signals constituting a first pair of complementary output signals,
the first means including means responsive to the first polarity of the first synchronizing signals for equalizing the output signals in the first pair,
the second output signals constituting a second pair of complementary output signals,
the second means including means responsive to the second polarity of the second synchronizing signals for equalizing the complementary output signals in the second pair.

30. In combination,
first means for providing at a first frequency analog representations of binary logic signals coded to represent a binary "1" and a binary "0",
second means for providing first clock signals alternately having first and second opposite polarities at a particular frequency half that of the first frequency,
third means for providing second clock signals alternately having first and second opposite polarities at the particular frequency, the phase of the second clock signals being opposite at each instant to the phase of the first clock signals,
fourth means responsive to the analog representations and the first clock signals for producing first voltages, in the first polarities of the first clock signals, in accordance with the analog representations and for producing, in the second polarities of the first clock signals first output signals representative of the first voltages,
fifth means responsive to the analog representations and the second clock signals for producing second voltages, in the first polarities of the second clock signals, in accordance with the analog representations and for producing, in the second polarities of the second clock signals, second output signals representative of the second voltages, and
output means for combining the first and second output signals.

31. In a combination as set forth in claim 30,
the first output signals constituting a first pair of complementary output signals, sixth means responsive to the first polarity of the first clock signals for equalizing the complementary output signals in the first pair, and the second output signals constituting a second pair of complementary output signals, seventh means responsive to the first polarity of the second clock signals for equalizing the complementary output signals in the second pair.

32. In a combination as set forth in claim 31 wherein the fourth means include first analog amplifier means for producing the first voltages and the first output signals, and the fifth means include second analog amplifier means for producing the second voltages and the second output signals.

33. In a combination as set forth in claim 32 wherein the fourth means include first and second lines and wherein the first voltages are produced in the first polarity of the first clock signals on a complementary basis in the first and second lines in accordance with the analog representations and wherein means are included for isolating the first and second lines from the output means in the first polarity of the first clock signals and wherein the fifth means include third and fourth lines and wherein the second voltages are produced in the first polarity of the second clock signals on a complementary basis in the third and fourth lines in accordance with the analog representations and wherein means are included for isolating the third and fourth lines from the output means in the first polarity of the second clock signals.

* * * * *